United States Patent

[11] 3,577,016

[72] Inventor Hans E. Weidmann
Glendale, Wis.
[21] Appl. No. 759,339
[22] Filed Sept. 12, 1968
[45] Patented May 4, 1971
[73] Assignee Allen-Bradley Company
Milwaukee, Wis.

[54] LOW PASS ACTIVE FILTER
7 Claims, 2 Drawing Figs.

[52] U.S. Cl. .......... 307/297, 321/10
[51] Int. Cl. .......... H03k 1/14
[50] Field of Search .......... 307/297, 296; 328/167, 263; 333/29; 321/10

[56] References Cited

UNITED STATES PATENTS

| | | | |
|---|---|---|---|
| 3,219,912 | 11/1965 | Harrison | 307/297X |
| 3,322,971 | 5/1967 | Liu | 307/297 |
| 3,323,038 | 5/1967 | Greenberg et al. | 307/297X |
| 3,414,824 | 12/1968 | Weidmann et al. | 328/167 |
| 3,469,178 | 9/1968 | Gardner | 307/297X |

*Primary Examiner*—Roy Lake
*Assistant Examiner*—James B. Mullins
*Attorneys*—Arthur H. Seidel and Thomas O. Kloehn

ABSTRACT: A filter circuit for connection between a direct current power supply and a load which has incorporated in the series line running between the input and output terminals of the filter circuit a network that presents a high impedance to alternating current components that appear at either end of the filter, such network presenting relatively small resistance to direct current load currents that flow through the filter. The network shown has a transister with its emitter and collector elements connected in the filter series line, and the base element of the transistor is connected to (i) a bias resistor that has its opposite end joined through a diode with the transistor collector, and (ii) a smoothing capacitor that has its opposite side joined with the transistor emitter.

INVENTOR
HANS E. WEIDMANN

BY

ATTORNEY

LOW PASS ACTIVE FILTER

BACKGROUND OF THE INVENTION

Filters that conduct direct current between a power source and a load and function to block alternating components from flowing back through the filter from the load to the power source have taken several physical forms. One such form is disclosed in U.S. Letters Pat. No. 3,414,824 dated Dec. 3, 1968 and entitled ACTIVE LOW PASS FILTER. The filter shown in that application utilizes active circuit components and is intended primarily for the suppression of alternating components that are generated within the load, so that these alternating components do not travel back to the power line leading to the direct current power source. As a part of such filter circuit there is provided a transistor in a series line extending from one end of the filter to the other. This transistor passes direct current in one direction, but functions to attenuate or suppress alternating components attempting to flow in the opposite direction through the filter. In such filter alternating components generated or appearing at the input end of the filter are not attenuated. Hence, if the load connected to the output end of the filter is sensitive to alternating components, then the direct current power source must have a high quality output of very small ripple. This requires that the power source incorporate adequate filtering for obtaining a smooth direct current output.

Many filter applications require that the filter have the ability to suppress alternating components in both directions through the filter. Usual passive filters admirably fulfill this requirement, for the reason that their individual components comprised of inductors and capacitors display their conductive and capacitive characteristics equally in both directions of current flow. This is generally not the situation for active circuit networks comprising transistors and operational amplifiers used in active types of filters. The present invention provides an active network that is contrary to this general observation, and thus it provides for the attenuation of alternating components in both directions of current flow through a filter utilizing active components.

SUMMARY OF THE INVENTION

The present invention comprises a network of individual components for use in a filter circuit for the suppression of alternating components which comprise a current valve, such as a transistor, with the control element thereof, which is the base in the instance of a transistor, connected to both a resistor and a capacitor. The resistor has its opposite end connected with one of the load current conducting elements of the current valve, and the capacitor has its opposite side connected with the other load current conducting element of the current valve.

The circuit of the invention may be disposed in a series line of a filter, and as shown and described hereinafter it may either be part of a low-pass active filter, or it may be incorporated within a filter in which the other components are entirely passive in character. A filter incorporating the invention will have the advantage of attenuating alternating components that are generated, or which appear, at either end of the filter, while maintaining the advantage of high attenuation at low frequencies. The attenuating characteristic is not linear with frequency, but instead rises sharply, similarly as the characteristic curve of a passive *pi*-type filter and it is one of the objects of the invention to obtain high attenuation for a board spectrum of frequencies commencing at low values.

Other objects of the invention are to have a filter with very low resistance to direct current flow when an associated load demands current, to have high power capability and to achieve simplicity in circuit construction. These and other objects and advantages of the invention will appear from the following description, in which reference is made to the accompanying drawing which shows by way of illustration but not of limitation specific forms in which the invention may be practiced.

DESCRIPTION OF PREFERRED EMBODIMENTS

Figure 1:
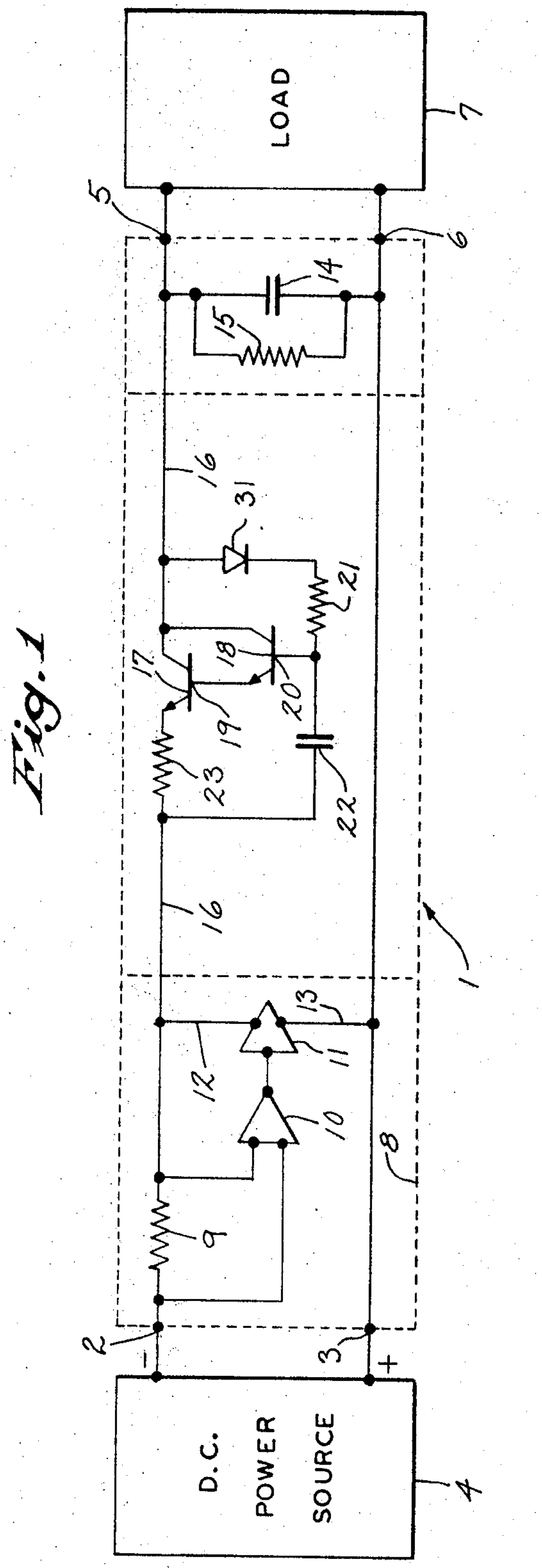
FIG. 1 is a circuit diagram of a low-pass active-type filter embodying the invention.

Referring to FIG. 1, there is shown a low-pass active-type filter 1 that is designated by three dotted, adjacent rectangles which surround the components making up such filter. The filter 1 has a pair of input terminals 2 and 3 that are joined to a direct current power source 4 and a pair of output terminals 5 and 6 that are joined to a load 7. The low-pass filter 1 functions to conduct and deliver direct current power to the load 7 and to attenuate alternating voltage components generated by the load 7, so that such components are suppressed from flowing back to the direct current power source. The purpose in suppressing alternating components developed within the load can be to protect the power source 4 from injurious effect that alternating components may have upon it, or to render it virtually impossible for someone to tap the leads from the power source for the purpose of attempting to detect the alternating components in order to decipher operations at the load. Whatever the particular purpose, a discussion of low-pass active filters is set forth in said U.S. Pat. No. 3,414,824 dated Dec. 3, 1968 and entitled ACTIVE LOW PASS FILTER.

Portions of the filter 1 of FIG. 1 are substantially the same as in said copending application. One of these parts is a transconductance amplifier 8 comprised of the circuit components in the left-hand dotted rectangle that is a part of the filter 1. This amplifier 8 is made up of a low impedance alternating current sensing resistor 9, a voltage amplifier 10 and a second amplifier 11 having its output in a filter shunt line comprised of the leads 12 and 13. These elements function to detect alternating current components from the load 7 that establish a voltage across the resistor 9. This voltage is amplified by the amplifiers 10 and 11 and the output of the amplifier 11 is such that a low impedance is established through the leads 12, 13 to shunt alternating current components whenever an alternating component is detected across the resistor 9. This operation is covered in said U.S. Pat. No. 3,414,824, and is not a part of the present invention, but is briefly described herein to illustrate an environment for the invention.

The right-hand dotted rectangle comprises an energy storage capacitor 14 shunted by a discharge resistor 15. These elements are also similar to corresponding elements in said U.S. Pat. No. 3,414,824, and the function is to provide energy storage in the capacitor which will be utilized intermittently by the load 7. Again, the description of this part of the filter appears in greater detail in said U.S. Pat. No. 3,414,824.

The central dotted rectangle identifying the low-pass filter 1 comprises the circuit network of the present invention. There is a filter series line 16 extending between the input terminal 2 and the output terminal 5 which is interrupted by a number of circuit elements. One of these elements is a current controlling valve in the form of an impedance transistor 17 having its emitter and collector connected in the series line 16 so as to conduct load current. The transistor 17 is connected in a so-called Darlington configuration with a second, or driving transistor 18. In this configuration, the collectors of the two transistors 17, 18 are connected to one another and the emitter of the transistor 18 is connected to the base 19 of the transistor 17. The base 20 of the transistor 18 is connected to one end of a bias resistor 21 and also to one side of a smoothing capacitor 22. The resistor 21 has its opposite end connected through a diode 31 to the collectors of the transistors 17, 18 and to the filter series line 16. The side of the capacitor 22 opposite the base 20 is also connected back to the series line 16 but the opposite side of the transistor 17. To complete the circuit, there is a resistor 23 that is joined in the line 16 with one end directly connected to the emitter of the transistor 17.

In the operation of the filter 1 it is the function of the transistor 17 to act as a high impedance to alternating components, regardless of the end of the filter 1 at which such components appear or are generated. The transistor 17 also functions to present only a small relatively fixed voltage drop for direct current, so that the direct current voltage for the load remains nearly constant regardless of the value of the direct current flowing through the filter. When the circuit is in operation, a current flows through the diode 31, the resistor 21, the base element 20 of the driver transistor 18, the base element 19 of the transistor 17 and the emitter of the transistor 17. The driver transistor 18 then conducts, and it provides a base current for the transistor 17. This current establishes a particular characteristic curve upon which the transistor 17 will operate, and since the characteristic curve is substantially horizontal over a range of collector-emitter voltage any fluctuation in such voltage which occurs by reason of alternating components will have negligible affect upon the collector current. Hence, collector current remains substantially constant, and this suppresses the passage of alternating current components through the transistor 17 regardless of whether such components are generated or appear at the output or input end of the filter 1. The transistor 17 therefore functions as a large attenuating impedance to alternating components, while allowing direct current power to pass to meet the requirements of the load 7 and the storage capacitor 14.

For establishing the point of operation of the transistor 17, a voltage drop appears across the diode 31 which is between the transistor base and collector. The voltage across the resistance 21 is kept small in relation to that of the diode 31, for example the voltage across the diode 31 may be a volt and that across the resistor one-tenth of 1 volt. Since the base-emitter voltage is small, the diode voltage drop determines the collector-emitter voltage, and hence establishes a point of operation of the transistor 17 on the flat portion of the transistor characteristic curve. To maintain this collector-emitter voltage of the transistor 17 essentially constant for various levels of direct current flow through the series line 16, the diode 31 is preferably operated in a region of its characteristic curve where voltage change with current change is small; hence, it may be said that the diode 31 is operated beyond the knee of its characteristic curve.

The capacitor 22 and resistor 21 provide an RC circuit that smooths out alternating components which may otherwise appear in the base circuit of the transistor 17, thereby giving a more constant base current to maintain operation of the transistor 17 on a preselected characteristic curve. In referring to the base circuit of the transistor 17, it is meant to include the resistor 21, capacitor 22 and diode 31 regardless of the intermediate position of the transistor 18. By connecting the capacitor 22 across the base and emitter elements of the transistor 17 the circuit functions to suppress alternating current components whether they are generated at the left or the right of the filter circuit.

The resistor 23 may be incorporated into the circuit to improve the horizontal character of the characteristic curve over which the transistor 17 operates. Upon the appearance of any alternating current components through the emitter-collector circuit the voltage developed across the resistor 23 has a counterbalancing effect, to thereby maintain transistor operation on the preselected characteristic curve. The resistor 23 also presents a slight additional voltage drop across the circuit network in the series line 16, but this may be minimal so as not to adversely diminish the efficiency of delivering direct current power to the load 7.

Figure 2:
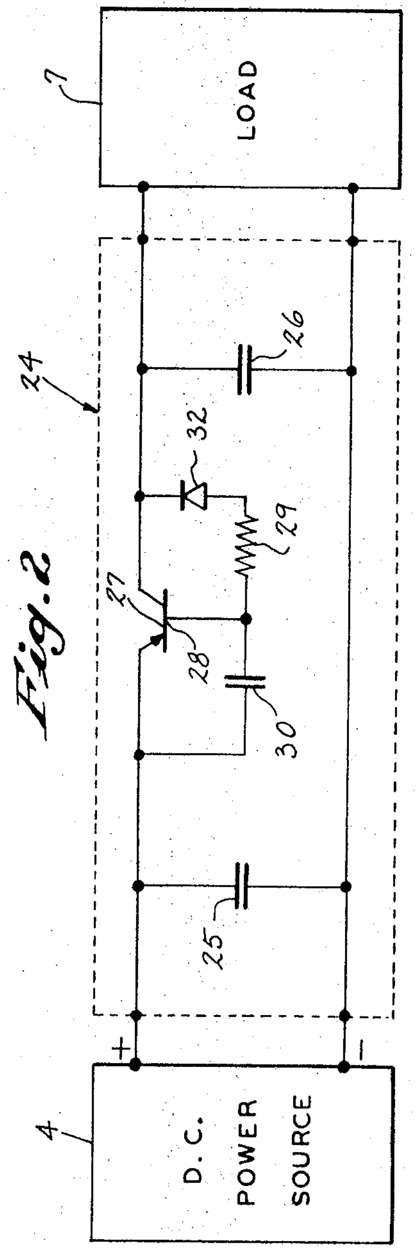
FIG. 2 is a circuit diagram of a *pi*-type filter embodying the invention in which the shunt lines of the filter are passive elements.

The invention may also be incorporated in a filter comprised of passive shunt elements, as illustrated in FIG. 2. In FIG. 2 there is a direct current power source 4 and a load 7 which are connected to one another through a filter 24 comprised of the circuit within the dotted rectangle. A pair of capacitors 25 and 26 form the shunt lines of the filter, and in one of the series lines of the filter there is interposed a transistor 27. The transistor 27 compares with the transistor 17 of FIG. 1, and its circuit is simplified by the omission of a driving transistor; so that a Darlington connection is not utilized. The base 28 of the transistor 27 has a first connection with one end of a bias resistor 29 that is connected at its opposite end to a diode 32. The resistor 29 and diode 32 are across the base and collector elements of the transistor 27. The transistor base 28 has a second connection with a smoothing capacitor 30, which capacitor 30 is connected across the base and emitter elements of the transistor 27. The filter 24 is of the *pi*-type in which passive elements, comprising capacitors 25 and 26, form the filter shunt lines and in which an active circuit element comprises the impedance in the series line of the filter.

The operation of the filter 24 is similar to that of *pi*-type filters of the passive type. The transistor 27, however, presents an active circuit component that presents a high impedance to alternating current components down to very low frequencies, but which readily transmits direct current. Hence, the circuit of the invention replaces an inductive element of an otherwise passive filter, and provides a frequency response characterized by a large impedance that extends down into a low frequency range. This impedance at low frequencies is accomplished by use of active circuit components of small physical size, whereas in a passive filter a much larger inductive component would be required to achieve the same result.

The invention provides a network for attenuating alternating current components that appear or are generated at either end of a filter circuit of which the network is a part. It finds particular advantage in filters in which a load may generate alternating current components that should be suppressed from passing back to a power source or transmission lines connected to the filter input.

In summary, the embodiments described have a current controlling valve in the form of a transistor that has two of its elements inserted in a filter series line. The valve also has a control element joined to a resistor and capacitor. In FIG. 1 this connection is made through a driving transistor, while in FIG. 2 the connection is direct. It can be said that in both embodiments shown the resistor is connected across the control element and one of the other valve elements, and that the capacitor is connected across the control element and the remaining valve element. The entire circuit network of the invention is joined in one of the filter series lines and is isolated from the other series line. The filter shunt lines can take any of a variety of forms. In FIG. 2 the shunt lines are passive elements of classic nature, and in FIG. 1 the shunt lines are quite specialized, even to the point that the storage capacitor in FIG. 1 may be a shunt that has little, if any, filtering purpose.

I claim:

1. In a filter circuit having a storage element at the output end thereof and a variable impedance shunting circuit at the input end thereof, the combination therewith of:
 a current controlling valve having load current conducting elements connected between said storage element and said variable impedance shunting circuit, said valve further including a control element;
 a diode;
 a bias resistor connected to said diode, and said resistor and diode being connected between said control element of said valve and one of said valve load current conducting elements; and
 a smoothing capacitor connected between said control element of said valve and the other of said valve load current conducting elements.

2. In a filter circuit having a storage element at the output end thereof and a variable impedance shunting circuit at the input end thereof, the combination therewith of:
 first and second transistors with a common collector connection and the emitter of the second transistor joined to the base of the first transistor; a first resistor connected to the emitter of the first transistor, said first resistor and said first transistor connected between said storage element and said variable impedance shunting circuit;

a capacitor connected across the base of said second transistor and said first resistor; and a bias resistor and a voltage establishing means connected across the base of said second transistor and the common collector connection of said transistors.

3. In a filter circuit of the *pi*-type having capacitors for the shunt lines and a series line extending between the shunt lines, the combination of:

a transistor with its collector and emitter inserted in the series line;

a diode circuit with resistance joined across the transistor base and one of the other transistor elements; and a capacitor joined across the transistor base and the other of the emitter and collector elements.

4. In a filter circuit having a series line the combination of:

a transistor having its emitter and collector in the series line;

a smoothing capacitor across the transistor base and the series line; and a bias resistor and diode across the transistor base and the series line, said diode being operated in a region beyond the knee of its characteristic curve.

5. In a filter circuit having input terminals for connection with a power supply, output terminals for connection with a load, first shunt circuit elements across the input connections, and second shunt circuit elements across the output connections, the combination therewith of:

a transistor having its collector and emitter elements connected between said input and output terminals, such elements also being connected between said first and second shunt circuit elements, and said transistor also having a base element;

a bias resistor connected between said base element and one of the other elements of said transistor;

a diode in circuit with said bias resistor; and a smoothing capacitor connected between the base element and the remaining element of said transistor.

6. In a filter circuit having input and output terminals and a series line extending between an input terminal and an output terminal, the combination of:

a current controlling valve having first and second load current conducting elements connected in the series line, and also having a control element;

a capacitor connected across said control element and the portion of the series line joined to said first load current conducting element; and a voltage controlling means connected across said control element and the portion of the series line joined to said second load current conducting element, such voltage controlling means having a characteristic curve with a region in which voltage change with current change is small, and being operated in such region to maintain a relatively constant voltage drop across itself.

7. A filter circuit as in claim 9 having resistance in circuit with said control element and said voltage controlling means to establish a current for said control element.